(12) United States Patent
Kim et al.

(10) Patent No.: US 9,449,911 B1
(45) Date of Patent: Sep. 20, 2016

(54) FAN-OUT WAFER LEVEL PACKAGE AND MANUFACTURING METHOD THEREOF

(71) Applicant: STS Semiconductor & Telecommunications Co., Ltd., Cheonan-si, Chungcheongnam-do (KR)

(72) Inventors: Hee Cheol Kim, Cheonan-si (KR); Jae Hyun Yoo, Seoul (KR); Young Seok Lee, Daegu (KR)

(73) Assignee: STS SEMICONDUCTOR & TELECOMMUNICATIONS CO., LTD. (KR)

( * ) Notice: Subject to any disclaimer, the term of this patent is extended or adjusted under 35 U.S.C. 154(b) by 0 days.

(21) Appl. No.: 14/800,990

(22) Filed: Jul. 16, 2015

(30) Foreign Application Priority Data

Jun. 5, 2015  (KR) .................. 10-2015-0079734

(51) Int. Cl.
| | | |
|---|---|---|
| *H01L 23/48* | (2006.01) | |
| *H01L 29/40* | (2006.01) | |
| *H01L 23/498* | (2006.01) | |
| *H01L 21/48* | (2006.01) | |
| *H01L 21/56* | (2006.01) | |
| *H01L 23/31* | (2006.01) | |

(52) U.S. Cl.
CPC ..... *H01L 23/49838* (2013.01); *H01L 21/4853* (2013.01); *H01L 21/56* (2013.01); *H01L 23/3178* (2013.01); *H01L 23/49811* (2013.01); *H01L 23/49866* (2013.01)

(58) Field of Classification Search
CPC .................. H01L 24/81; H01L 2224/02333; H01L 23/485; H01L 23/49811; H01L 2224/023; H01L 2224/06147; H01L 2021/60022; H01L 2224/13147; H01L 2224/73103
See application file for complete search history.

(56) References Cited

U.S. PATENT DOCUMENTS

| | | | | |
|---|---|---|---|---|
| 7,830,006 B2 * | 11/2010 | Kolan | ................ | H01L 21/566 257/693 |
| 2005/0224968 A1 * | 10/2005 | Ho | ................ | H01L 24/97 257/737 |
| 2006/0214288 A1 | 9/2006 | Ohsumi | | |
| 2011/0278716 A1 * | 11/2011 | Hsu | ................ | H01L 24/11 257/737 |

\* cited by examiner

*Primary Examiner* — Jasmine Clark

(57) ABSTRACT

Provided are a wafer level package and a manufacturing method thereof. The wafer level package method includes preparing a patterned wafer, forming a recess in a position, in which a semiconductor chip is to be attached, of the patterned wafer through an etching process, fixing the semiconductor chip to the interior of the recess, and applying a passivation material to portions other than the semiconductor chip within the recess and to an upper end of the wafer. The wafer level package includes a silicon or glass wafer including a recess formed through etching and having an area larger than a semiconductor chip, a semiconductor chip fixed to the interior of the recess, and a passivation material filling an empty space other than the semiconductor chip within the recess and applied to a portion corresponding to an area larger than the semiconductor chip on an upper end of the wafer.

8 Claims, 5 Drawing Sheets

FAN-OUT WAFER LEVEL PACKAGE AND MANUFACTURING METHOD THEREOF

CROSS-REFERENCE TO RELATED APPLICATIONS

This application claims priority under 35 U.S.C. §119 to Korean Patent Application No. 10-2015-0079734, filed on Jun. 5, 2015, the disclosure of which is incorporated herein by reference in its entirety.

TECHNICAL FIELD

The present invention relates to a semiconductor integrated circuit (IC) package and, more particularly, to a wafer level package using a fan-out scheme and a manufacturing method thereof.

BACKGROUND

Recently, various types of digital devices such as smartphones or tablets include numerous semiconductor chips. These semiconductor chips are manufactured in the form of a wafer during a semiconductor fabrication process, divided into chips through a packaging process, and installed in a printed circuit board (PCB) to exhibit functions thereof.

In the past, wafer-type chips were separated one by one and underwent a packaging process so as to be used. Conventionally, packaging methods such as a quad flat package (QFP), a chip scale package (CSP), or a ball grid array (BGA) has been used.

When chips are separately packaged, the chips should be handled individually, and thus, when a pattering operation, or the like, is performed, a problem of chip alignment arises. In addition, recently, chips tend to decrease in size, making it difficult to handle individual chips.

Wafer level packaging (WLP) is a method for overcoming such a problem. The WLP is a method of performing packaging entirely without separating chips from a wafer or rearranging chips in a wafer form and performing packaging thereon. After packaging is completed through this method, a dicing process is performed to dice chips one by one to use the chips. In this manner, the packaging process is simplified, a chip size after packaging is reduced, and an area of the chips mounted on a printed circuit board (PCB) is also reduced, remarkably improving the semiconductor assembly process.

Packages have been reduced in through the WLP, and recently, a chip scale package (CSP) in which a package size is substantially equal to a chip size has also been developed.

However, recently, as mobile markets such as smartphones, tablet PCs, or portable game devices have grown, it is required to further reduce a chip size, while the number of input/output (JO) terminals of chips tend to rather increase, rather than being reduced, and thus, there is limitations in coping with such demand with an existing fan-in type package such as the CSP.

The related art CSP is called a fan-in type CSP because an array of solder balls for input/output is not larger than a chip size. However, due to the development of fabrication technologies, chip sizes have been decreased, while the number of input/output terminals of chips have remain the same or rather increased for enhancement of performance, and thus, the fan-in type packages cannot support the increased number of input/output terminals, namely, the number of solder balls, in some cases.

As a solution, a wafer level package in which a region where solder balls are disposed is greater than a chip size has been developed, which is called a fan-out type wafer level package.

FIG. 1 is a flow of an existing process.

For a fan-out type package, spaces between chips need to be increased as much. However, spaces between chips in a wafer state are narrow, and thus a process of separating the chips in the wafer state and rearranging the separated chips to make the chips in a wafer form is additionally required.

In the existing fan-out wafer level package process, a double-sided tape for fixing chips is attached to a mother substrate (also called a sacrificial substrate or a parasitic substrate), and chips separated from a wafer are rearranged one by one.

Wafer level molding is performed on the rearranged chips. This is to fill a solder ball region wider than the chips, and in general, the solder ball region is filled using a mold compound. After chips are attached to the molding, a carrier removal/debonding step is performed to separate the mother substrate from the chips and the molding.

Thereafter, a general wafer level packaging the same as the related art fan-in packaging is performed. That is, general processes such as passivation for insulation or chip protection, patterning, re-distribution layer (RDL), and bonding are performed.

However, in spite of the aforementioned advantages, the existing fan-out level packaging has not been widely used due to problems too serious for actual mass-production. Typical problems thereof include chip alignment, warpage of wafer, and contamination.

A robot is used at the stage of rearranging chips on a mother substrate, and here, since it is not possible to adjust precision of the robot to a few micro scale, aligning chips in a wafer level after chip arrangement may have a problem, leading to difficulty in patterning or RDL.

Also, even though chips are properly aligned on a mother substrate, a mold compound used for molding is deformed due to contraction and expansion thereof, which is fatal in a packaging process requiring precision. In addition, particles of the mold compound may degrade production yield and contaminate chips.

Due to the aforementioned problems, a speed of fan-out wafer level packaging slows to obstruct mass-production.

SUMMARY

Accordingly, the present invention provides a fan-out wafer level package in which input/output terminals have an area larger than a chip size, and a manufacturing method thereof.

The object of the present invention is not limited to the aforesaid, but other objects not described herein will be clearly understood by those skilled in the art from descriptions below.

In one general aspect, a wafer level package method includes: preparing a patterned wafer; forming a recess in a position, in which a semiconductor chip is to be attached, of the patterned wafer through an etching process; fixing the semiconductor chip to the interior of the recess; and applying a passivation material to portions other than the semiconductor chip within the recess and to an upper end of the wafer.

In another general aspect, a wafer level package includes: a silicon or glass wafer including a recess formed through etching and having an area larger than a semiconductor chip; a semiconductor chip fixed to the interior of the recess; and a passivation material filling an empty space other than the semiconductor chip within the recess and applied to a portion corresponding to an area larger than the semiconductor chip on an upper end of the wafer.

Other features and aspects will be apparent from the following detailed description, the drawings, and the claims.

DETAILED DESCRIPTION OF EMBODIMENTS

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terms used herein are for the purpose of describing particular embodiments only and are not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, exemplary embodiments of the present invention will be described in detail with reference to the accompanying drawings.

Figure 1:
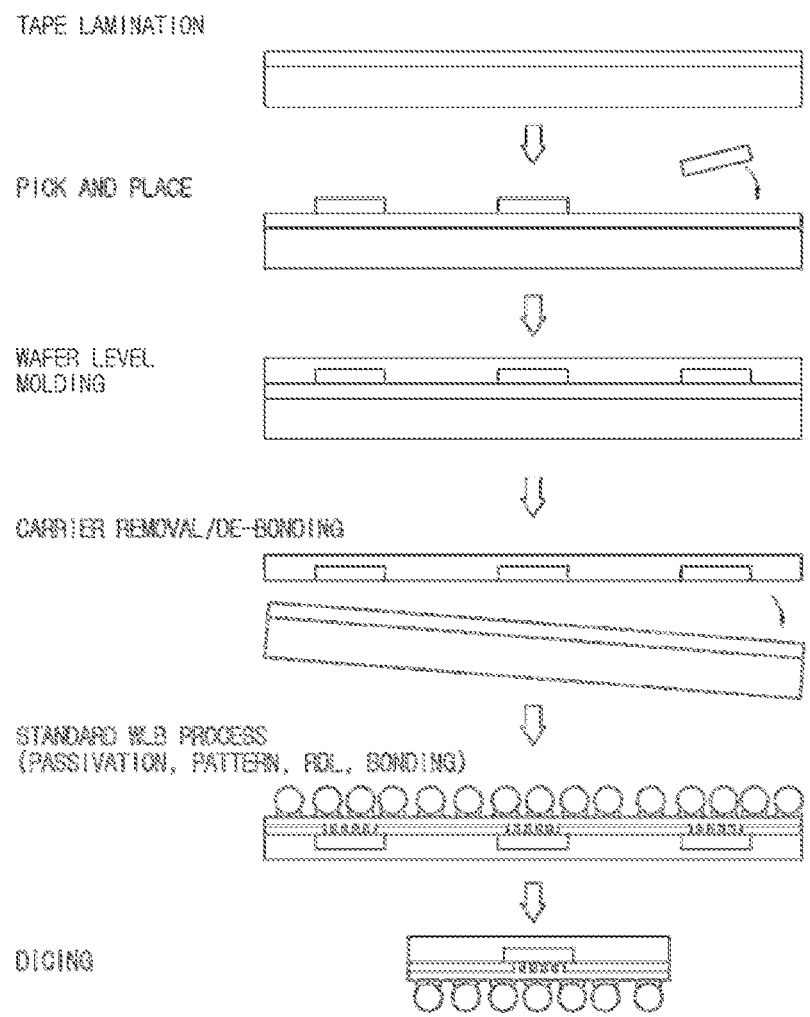
FIG. 1 is a flow of a related art fan-out wafer level package method.
Figure 2:
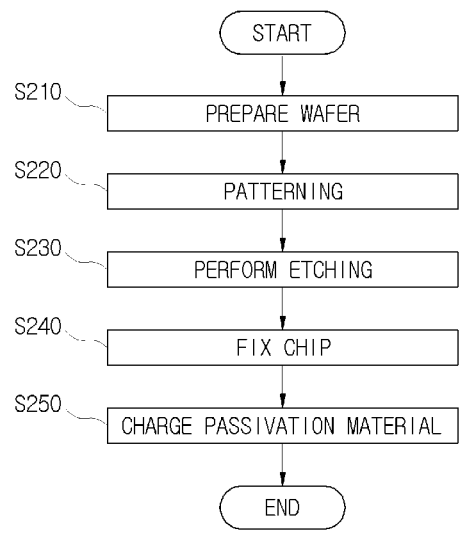
FIG. 2 is a flow chart illustrating a wafer level package method according to an embodiment of the present invention.

FIG. 2 is a flow chart illustrating a wafer level package method according to an embodiment of the present invention, and FIGS. 4 through 9 are cross-sectional views illustrating sequential steps of a wafer level package method according to an embodiment of the present invention.

First, a wafer 100 is prepared in step S210 and a patterning operation is performed on a position where a chip is to be installed in step S220.

Unlike the related art using a mold compound, since the wafer 100 formed of silicon or glass is used, warpage does not occur, and thus, problems such as alignment of a chip 140 or pattern uniformity in an RDL process caused due to warpage during a packaging process do not arise.

Also, since the patterning operation is performed using a photomask, an etching operation is performed on a pattern 110 to form a recess in which the chip 140 is to be positioned, and the chip 140 is disposed in the recess, a higher degree of precision (nanometer scale) may be obtained compared with the related art in which the chip 140 is disposed using a robot, and thus, chips 140 arranged after finishing the etching operation does not have an alignment problem such as that of the related art.

In order to form the recess 120 in which a chip 140 is to be installed in the patterned wafer 100, an etching step S230 is performed. The etching technique includes wet etching using a hydrofluoric acid liquid and dry etching using a tetrafluoromethane gas.

In particular, dry etching technique allows for precise controlling of an aspect ratio, by which a size of the recess 120 in which the chip 140 is to be installed may be minutely adjusted, reducing an unnecessary space after installation of the chip 140.

When the recess 120 is formed through etching to allow the chip 140 to be mounted thereon, a double-sided tape 130 called a die attach film (DAF) or an epoxy 130 for fixing the chip 140 is attached to the interior of the recess 120 and the chip 140 is mounted thereon. The DAF or epoxy for fixing the chip 140 has excellent thermal, mechanical characteristics, improving reliability.

Thereafter, in order to protect and insulate the chip 140, a passivation material 150 is applied to cover the periphery of the chip 140 and a portion of the chip 140 opposite to an attached surface of the chip 140 in step S250. As the passivation material 150, an epoxy or a non-conductive film (NCF) may be used.

After the foregoing operation is finished, processes such as passivation, patterning, re-distribution layer (RDL), and bonding are performed, and thereafter, a dicing process is performed to cut into chip units, thus completing a package.

Since the fan-out wafer level package uses a silicon or glass wafer, the package is not expanded or contracted by heat, eliminating warpage, and thus, a wafer alignment problem does not occur during a patterning operation in the wafer level. Also, unlike a mold compound, particles are note generated, eliminating contamination of the chip.

In addition, since the position of the chip is precisely determined by the etching operation, even though the chip is moved by a robot arm, or the like, to a position with less precision, the chip may be fixed to an accurate position by virtue of the etched recess, and thus, an alignment problem during a patterning operation for the RDL operation of the chip does not arise.

Figure 3:
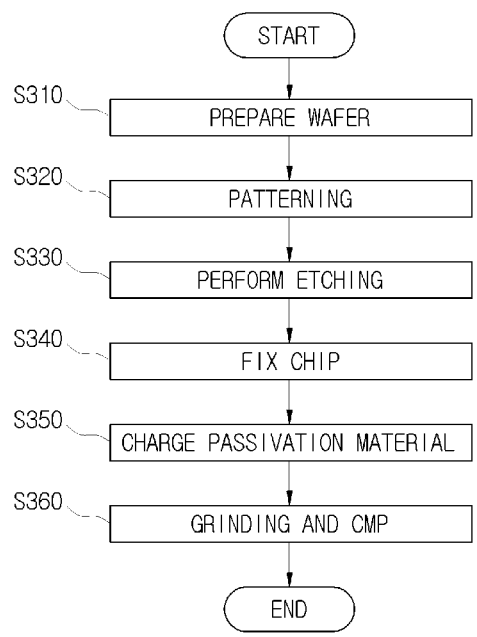
FIG. 3 is a flow chart illustrating a wafer level package method including a copper pillar (or a copper post) according to another embodiment of the present invention.
Figure 4:
FIGS. 4 through 9 are cross-sectional views illustrating sequential steps of a wafer level package method according to an embodiment of the present invention.
Figure 5:
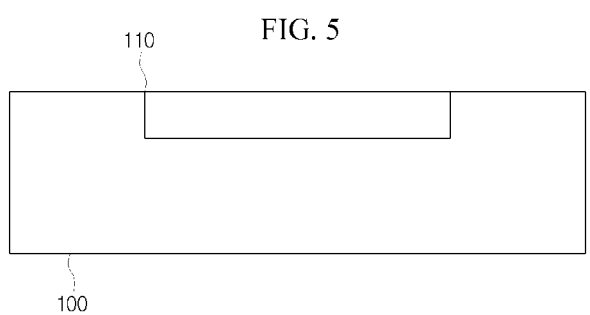
Figure 6:
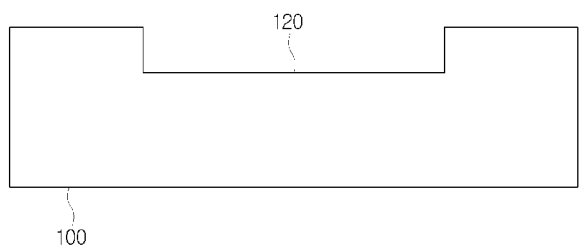
Figure 7:
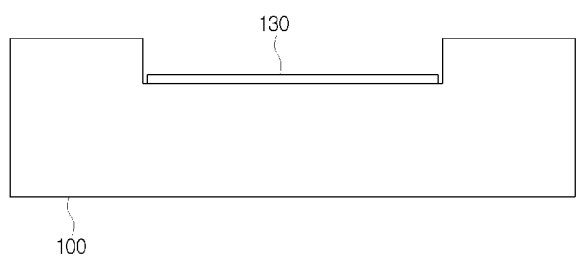
Figure 8:
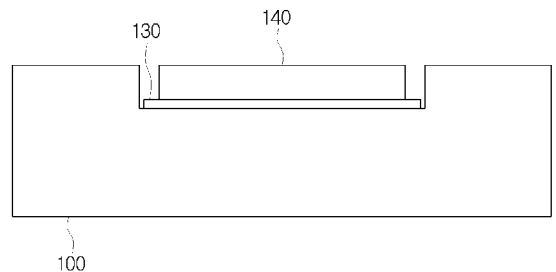
Figure 9:
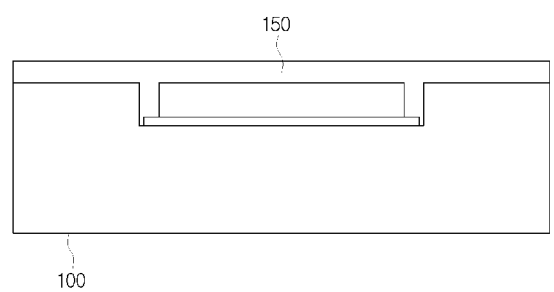
Figure 10:
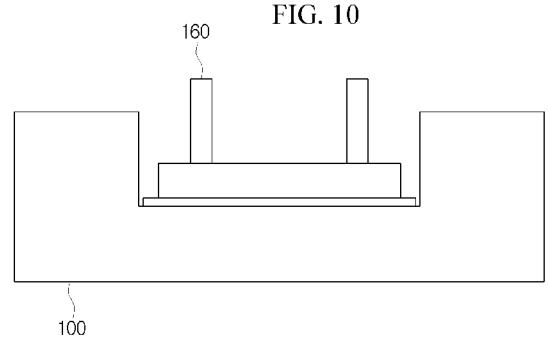
FIGS. 10 through 12 are cross-sectional views illustrating each step of a wafer level package method according to another embodiment of the present invention.
Figure 11:
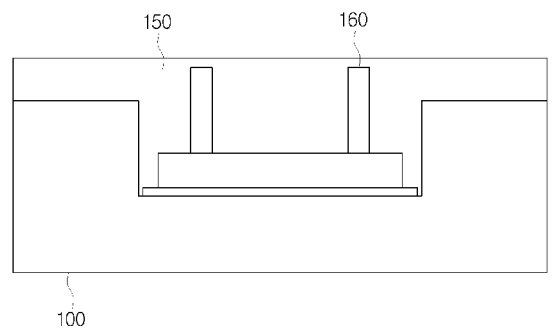
Figure 12:
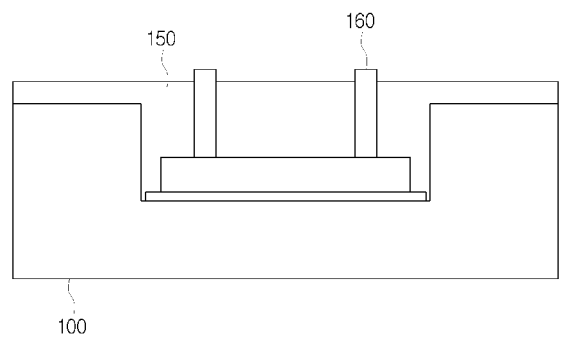

FIG. 3 is a flow chart illustrating a process of a packaging operation when a copper pillar is attached to a chip to enhance signal transmission performance, and FIGS. 10 through 12 are cross-sectional view illustrating a package of each of steps.

In general, in order to connect an input/output pad of the chip 140 and an RDL formed of copper, copper having a thickness ranging from 5 micrometers to 10 micrometers is used. In this respect, recently, since a signal speed becomes fast, resistance of a copper conducting wire may significantly act to degrade signal quality.

Thus, in the present invention, in order to connect the input/output pad of the chip 140 and the RDL, a copper pillar 160 having a thickness of about 50 micrometers, far thicker than that of the related art, is used. Such a copper pillar 160 serves to widen a passage between the input/output pad of the chip 140 and the RDL, reducing resistance to result in improvement of signal quality.

In case the copper pillar 160 is connected to the chip 140, a process required to connect the copper pillar 160 and the RDL is added after the packaging process of FIG. 2 described above.

When the step (S350) of applying the passivation material 150 to protect and insulate the chip 140 is performed, the copper pillar 160 is also covered with the passivation material 150. Thus, in order to connect the RDL and the copper pillar 160, the copper pillar 160 needs to be exposed to outside of the passivation material 150. To this end, the passivation material 150 is ground and polished through a grinding and chemical mechanical polishing (CMP) process (S360) to upwardly expose one end of the copper pillar 160 to outside of the passivation material 150.

One side of the exposed copper pillar 160 is connected to the RDL, and thereafter, operations such as RDL, insulator application, solder ball disposition, dicing, and the like, like general processes of a case without the copper pillar 160, are performed to complete a package.

Figure 13:
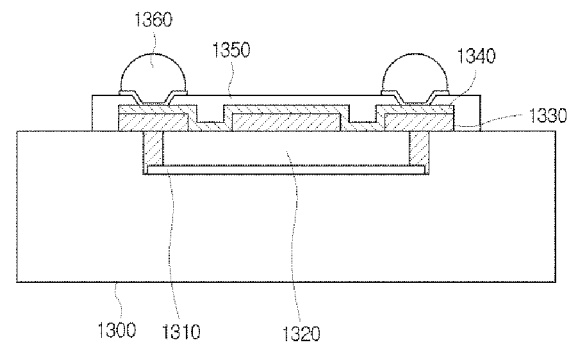
FIG. 13 is a cross-sectional view illustrating a wafer level package according to an embodiment of the present invention.

FIG. 13 is a cross-sectional view illustrating a fan-out wafer level package according to an embodiment of the present invention.

A wafer 1300 which has been patterned and subsequently etched is positioned in the lowermost portion. Since a chip 1320 is positioned in the etched portion of the wafer 1300, an alignment problem of the chip 1320 does not arise as mentioned above.

A double-sided tape 1310 for fixing the chip 1320 is positioned in a lower end portion of the etched recess. Here, as the double-sided tape 1310, a DAF or an epoxy may be used. The chip 1320 is fixed to the double-sided tape 1310, and a passivation material 1330, i.e., a protective material (or passivation material) or an insulating material, is applied to the periphery of the chip 1320, upper portions of the chip 1320, and upper portions of the wafer 1300 in which the chip 1320 is not positioned.

Like a general wafer level package, an RDL formed of copper 1340, another passivation material 1350, and solder balls 1360 are positioned on the passivation material 1330.

Figure 14:
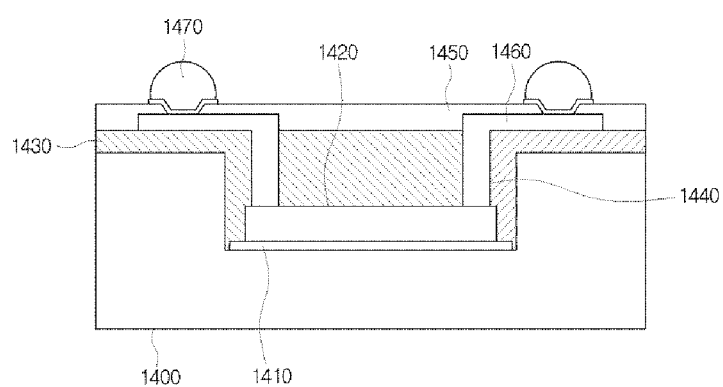
FIG. 14 is a cross-sectional view illustrating a wafer level package according to another embodiment of the present invention.

FIG. 14 is a cross-sectional view illustrating a package when a copper pillar 1440 is additionally attached to a chip 1420 to enhance input/output signal quality of the chip. Compared with the case of FIG. 13, the package is the same as that of FIG. 13, except that a copper pillar 1440 connecting an RDL 1460 and an input/output pad of the chip 1420 penetrate through a passivation material 1430 so as to be exposed.

In the fan-out wafer level package and a manufacturing method thereof described above, since packaging is performed by the wafer, the process may be simplified, and since a mold compound is not used, side effects that may result from the use of the mold compound may be fundamentally cut off. Also, various fan-out techniques may be developed and applied to mass-production.

According to the present invention, since the wafer level package method is employed using a silicon or glass wafer, contamination due to warpage or mold compound particles may be prevented.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A wafer level package method comprising:
preparing a patterned wafer;
forming a recess in a position, in which a semiconductor chip is to be attached, of the patterned wafer through an etching process;
attaching the semiconductor chip to an interior of the recess;
forming a copper pillar vertically contacting the semiconductor chip;
forming a first passivation material within the recess and on the semiconductor chip including an upper end surface of the wafer; and
forming a redistribution layer directly contacting the copper pillar and horizontally extended away from the copper pillar to be electrically connected with the semiconductor chip, thereby enhancing input/out signals for the semiconductor chip.

2. The wafer level package method of claim 1, wherein one end of the copper pillar for transmission of an input/output signal is connected to an input/output surface of the semiconductor chip.

3. The wafer level package method of claim 2, further comprising:
chemically or mechanically polishing the passivation material to allow the other end of the copper pillar to be exposed to outside of the passivation material, after the applying of the passivation material.

4. The wafer level package method of claim 1, wherein the wafer is formed of silicon or glass.

5. The wafer level package method of claim 1, wherein the etching process is performed as dry etching.

6. A wafer level package comprising:
a silicon or glass wafer including a recess formed through etching, and having an area larger than a semiconductor chip;
a semiconductor chip attached in an interior of the recess;
a first passivation material formed in the recess and on the semiconductor chip and on an upper end surface of the wafer;
a copper pillar vertically contacting the semiconductor chip; and
a redistribution layer directly contacting the copper pillar and horizontally extended away from the copper pillar to be electrically connected with the semiconductor chip, thereby enhancing input/out signals for the semiconductor chip.

7. The wafer level package of claim 6, wherein the semiconductor chip is fixed to the interior of the recess by an attachment film or an epoxy adhesive.

8. The wafer level package of claim 6, wherein the etching is performed as dry etching.

* * * * *